US012660195B2

(12) United States Patent
Chen et al.

(10) Patent No.: US 12,660,195 B2
(45) Date of Patent: Jun. 16, 2026

(54) FIN STRUCTURE FOR INCREASING PERFORMANCE OF FERROELECTRIC MEMORY DEVICE

(71) Applicant: Taiwan Semiconductor Manufacturing Company, Ltd., Hsinchu (TW)

(72) Inventors: Kuen-Yi Chen, Hsinchu City (TW); Yi Ching Ong, Hsinchu (TW); Kuo-Ching Huang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 675 days.

(21) Appl. No.: 17/724,937

(22) Filed: Apr. 20, 2022

(65) Prior Publication Data

US 2023/0345733 A1     Oct. 26, 2023

(51) Int. Cl.
H10B 51/30 (2023.01)
H10D 30/01 (2025.01)
(Continued)

(52) U.S. Cl.
CPC ........... H10B 51/30 (2023.02); H10D 30/024 (2025.01); H10D 30/0415 (2025.01); H10D 30/6211 (2025.01); H10D 30/701 (2025.01)

(58) Field of Classification Search
CPC ........ H10B 51/30; H10B 53/10; H10B 53/20; H10B 53/30; H01L 29/66795; H01L 29/6684; H01L 29/78391; H01L 29/785; H01L 29/7851; H01L 27/0886; H01L 27/1159; H01L 29/516; H01L 29/42376;

H01L 29/4958; H01L 29/4966; H01L 29/517; H01L 29/66545; H01L 29/161; H01L 29/66553; H01L 21/28176; H01L 21/02356; H01L 21/02532; H10D 30/024; H10D 30/0415; H10D 30/6211; H10D 30/6219; H10D 30/701; H10D 30/62; H10D 84/834; H10D 62/10; H10D 62/116; H10D 62/118; H10D 62/122; H10D 62/13; H10D 62/149; H10D 64/033; H10D 64/035; H10D 64/20; H10D 64/205; H10D 64/23; H10D 64/251; H10D 64/258; H10D 64/259; H10D 64/411; H10D 64/605; H10D 64/62;

(Continued)

(56) References Cited

U.S. PATENT DOCUMENTS

| 9,368,343 B1 * | 6/2016 | Cheng | .................... H01L 29/785 |
| 2008/0251779 A1 * | 10/2008 | Kakoschke | .......... H10N 70/245 |
| | | | 257/42 |

(Continued)

*Primary Examiner* — Natalia A Gondarenko
(74) *Attorney, Agent, or Firm* — Eschweiler & Potashnik, LLC

(57) ABSTRACT

Various embodiments of the present disclosure are directed towards an integrated chip including a fin structure extending vertically from a semiconductor substrate. The fin structure continuously extends laterally along a first direction. A ferroelectric memory stack overlies the fin structure and continuously laterally extends along a second direction that is substantially perpendicular to the first direction. The ferroelectric memory stack includes an upper electrode overlying a ferroelectric layer. The ferroelectric layer extends along opposing sidewalls and an upper surface of the fin structure.

20 Claims, 10 Drawing Sheets

(51) Int. Cl.
  H10D 30/62     (2025.01)
  H10D 30/69     (2025.01)
(58) Field of Classification Search
  CPC .... H10D 64/66; H10D 64/664; H10D 64/665;
         H10D 64/666; H10D 64/668; H10D
                                        64/669
  USPC ........................... 257/295, 5, 42, 764, 29.087
  See application file for complete search history.

(56)                References Cited

U.S. PATENT DOCUMENTS

| 2010/0188889 | A1* | 7/2010 | Hanafi | G11C 11/413 |
| | | | | 365/156 |
| 2015/0311085 | A1* | 10/2015 | Kozarsky | H10D 84/038 |
| | | | | 257/401 |
| 2015/0311349 | A1* | 10/2015 | Ramaswamy | H10D 30/024 |
| | | | | 257/295 |
| 2017/0317212 | A1* | 11/2017 | Kim | H10D 62/115 |
| 2018/0026119 | A1* | 1/2018 | Xu | H10D 64/017 |
| | | | | 438/283 |
| 2018/0151745 | A1* | 5/2018 | Chang | H10B 51/30 |
| 2020/0105622 | A1* | 4/2020 | Hsu | H10D 84/0167 |
| 2021/0083068 | A1* | 3/2021 | Lin | H01L 29/66795 |
| 2021/0143068 | A1* | 5/2021 | Xu | H10D 30/6735 |
| 2022/0149206 | A1* | 5/2022 | Maruyama | H01L 29/66795 |
| 2022/0199833 | A1* | 6/2022 | Shivaraman | H10D 64/017 |

* cited by examiner

100

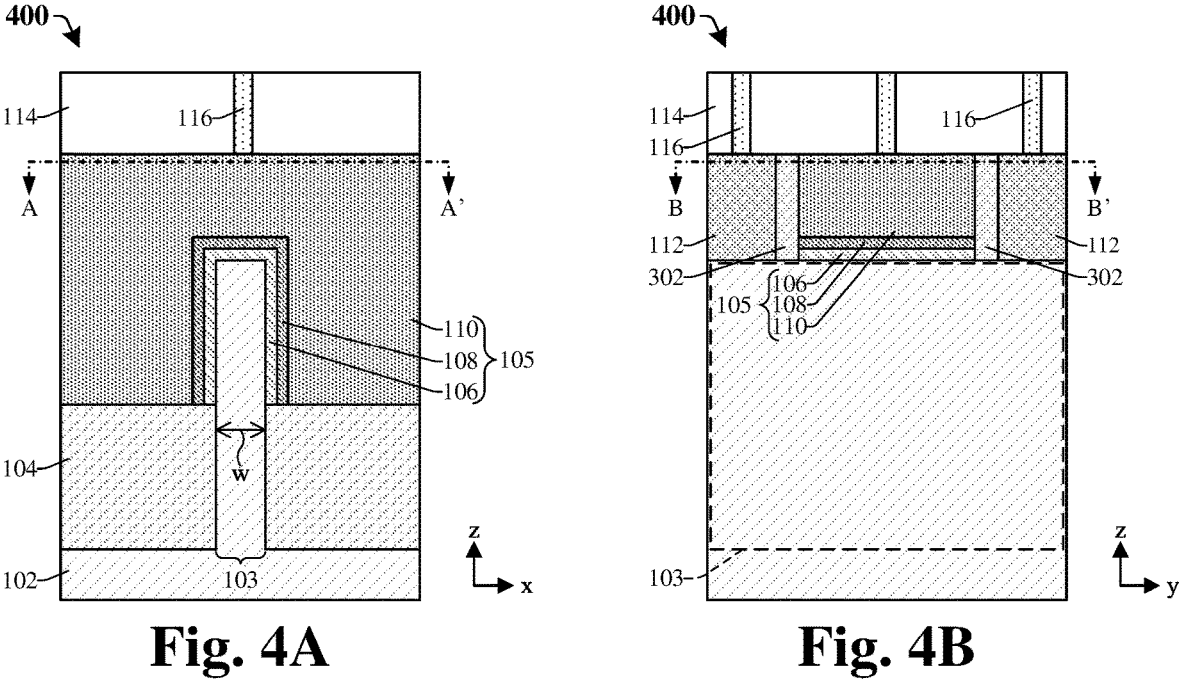
Fig. 4A          Fig. 4B
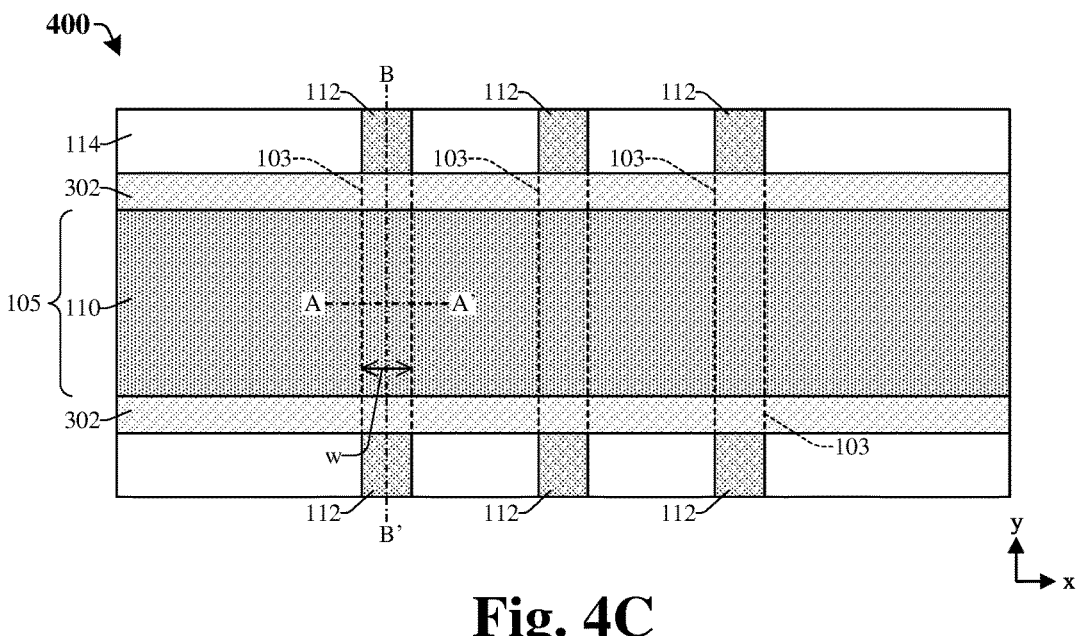
Fig. 4C

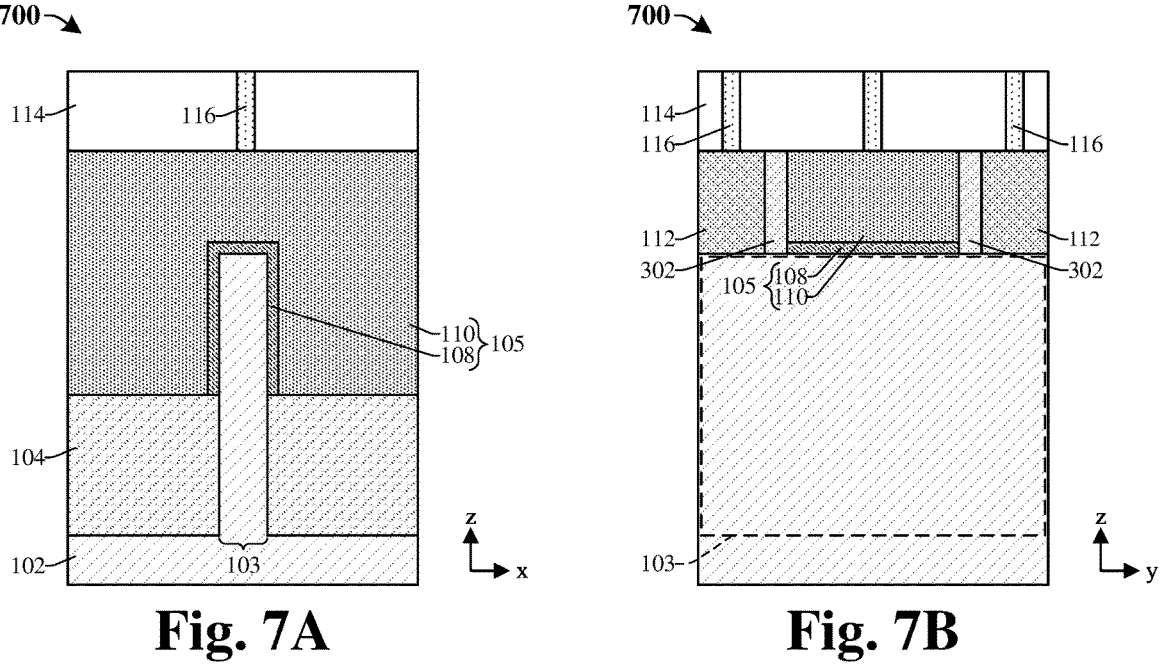
Fig. 7A		Fig. 7B
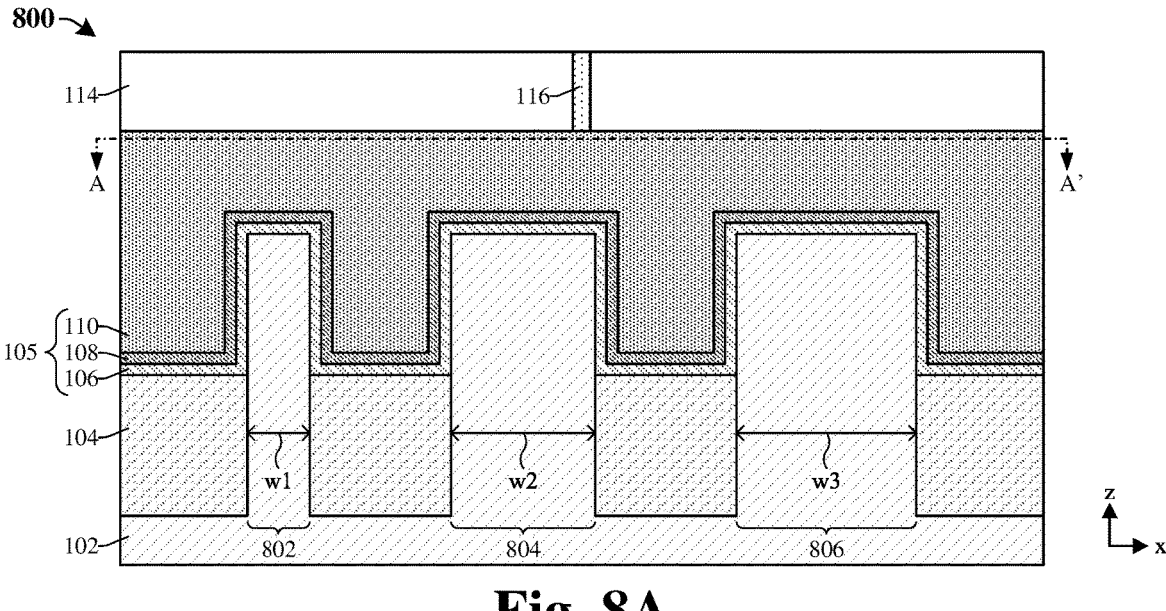
Fig. 8A

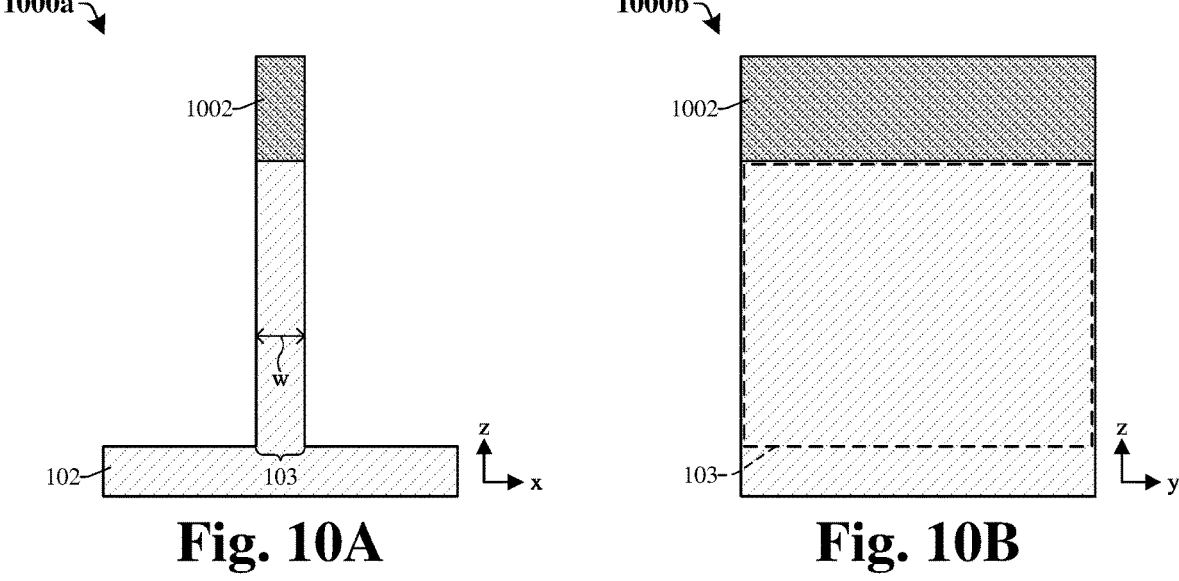
Fig. 10A     Fig. 10B
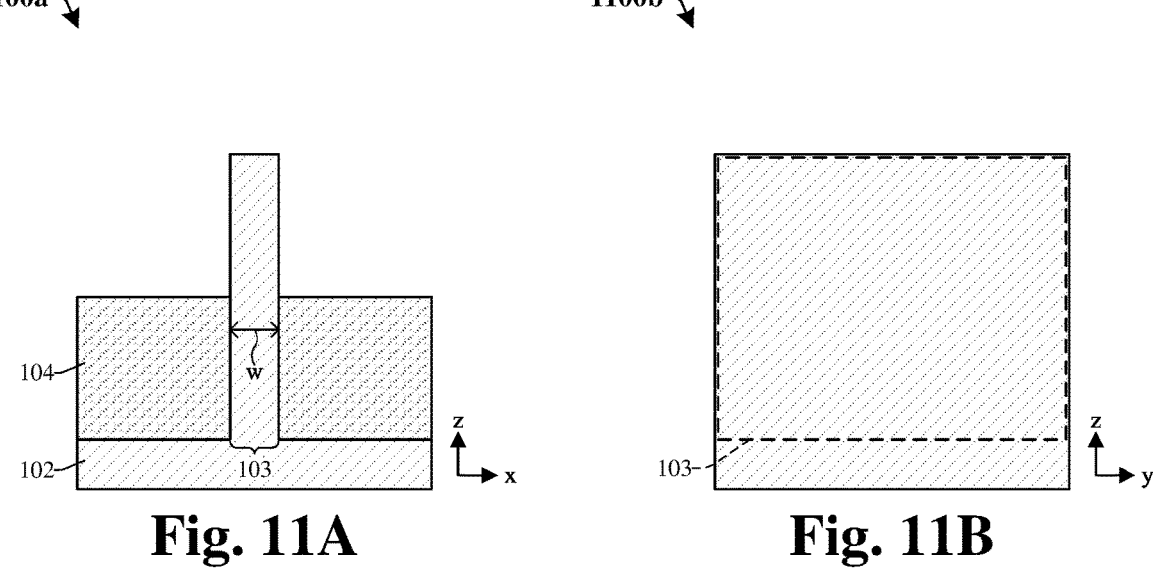
Fig. 11A     Fig. 11B

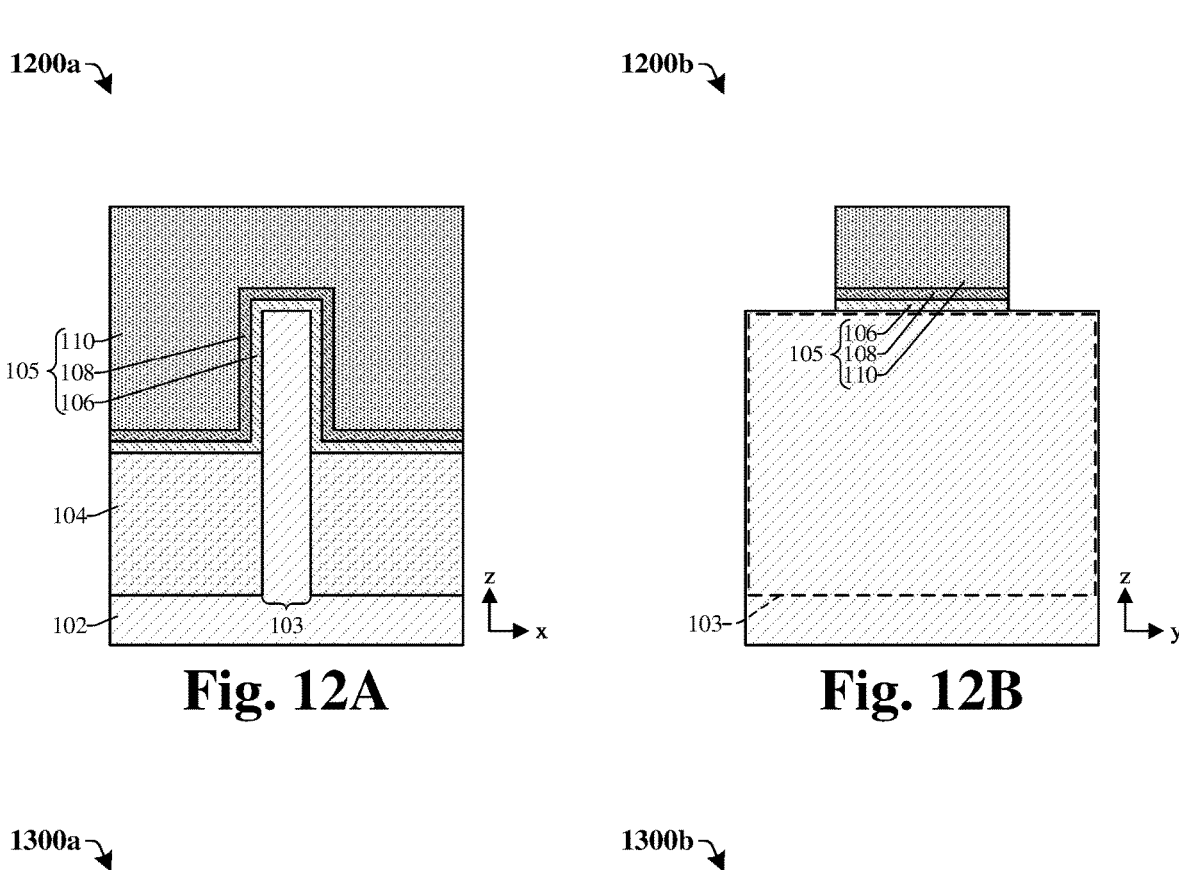
Fig. 12A
Fig. 12B
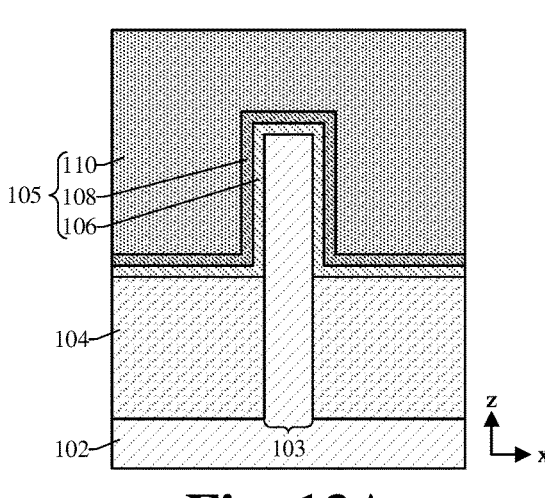
Fig. 13A
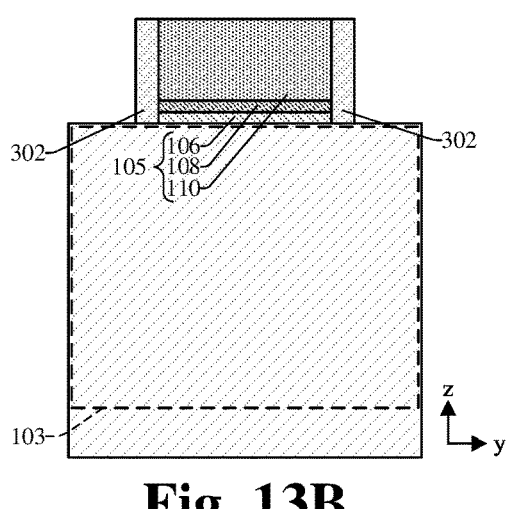
Fig. 13B

1400a

1400b

1500a

1500b

1600

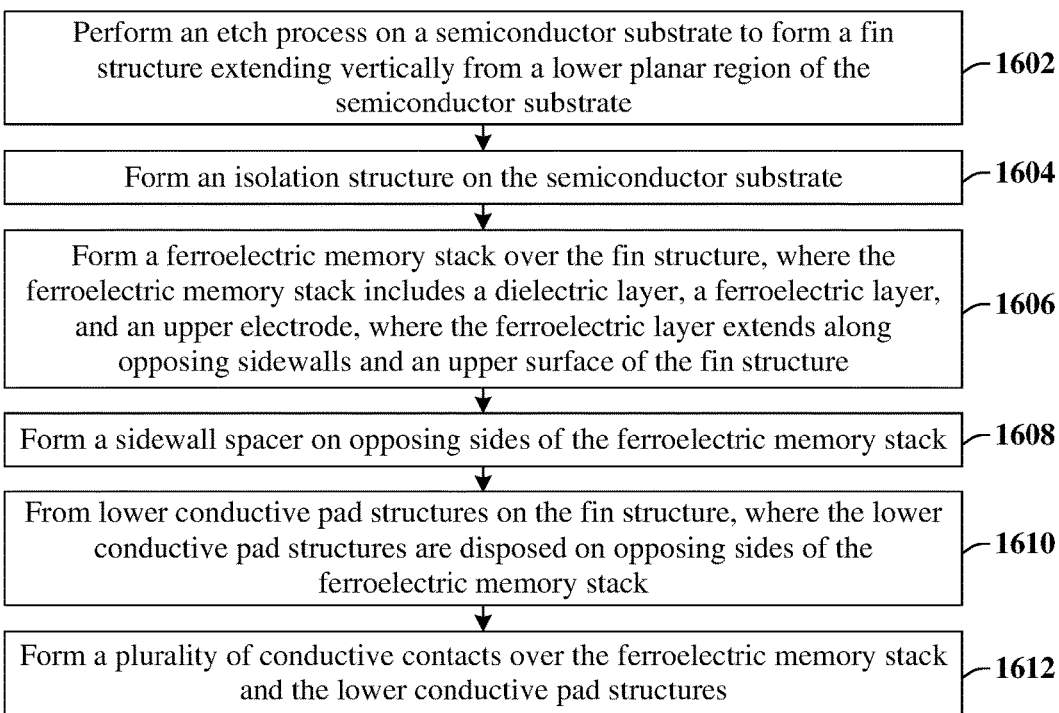

| Perform an etch process on a semiconductor substrate to form a fin structure extending vertically from a lower planar region of the semiconductor substrate | 1602 |

↓

| Form an isolation structure on the semiconductor substrate | 1604 |

↓

| Form a ferroelectric memory stack over the fin structure, where the ferroelectric memory stack includes a dielectric layer, a ferroelectric layer, and an upper electrode, where the ferroelectric layer extends along opposing sidewalls and an upper surface of the fin structure | 1606 |

↓

| Form a sidewall spacer on opposing sides of the ferroelectric memory stack | 1608 |

↓

| From lower conductive pad structures on the fin structure, where the lower conductive pad structures are disposed on opposing sides of the ferroelectric memory stack | 1610 |

↓

| Form a plurality of conductive contacts over the ferroelectric memory stack and the lower conductive pad structures | 1612 |

Fig. 16

FIN STRUCTURE FOR INCREASING PERFORMANCE OF FERROELECTRIC MEMORY DEVICE

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4C illustrate various views of some embodiments of an FTJ device comprising a ferroelectric layer overlying and disposed on opposing sides of a plurality of fin structures.

FIGS. 5A-5B through 7A-7B illustrate various cross-sectional views of some different embodiments of an FTJ device corresponding to some alternative embodiments of the FTJ device of FIGS. 1-3.

FIGS. 8A-8C illustrate various views of some embodiments of an FTJ device comprising a ferroelectric layer overlying and disposed on opposing sides of a plurality of fin structures, where the fin structures have different widths from one another.

FIGS. 10A-10B through 15A-15B illustrate various cross-sectional views of some embodiments of a method for forming an FTJ device having a ferroelectric layer disposed on opposing sides and an upper surface of a fin structure.

FIG. 16 illustrates a flow chart of some embodiments of a method for forming an FTJ device having a ferroelectric layer disposed on opposing sides and an upper surface of a fin structure.

DETAILED DESCRIPTION

Figure 1:
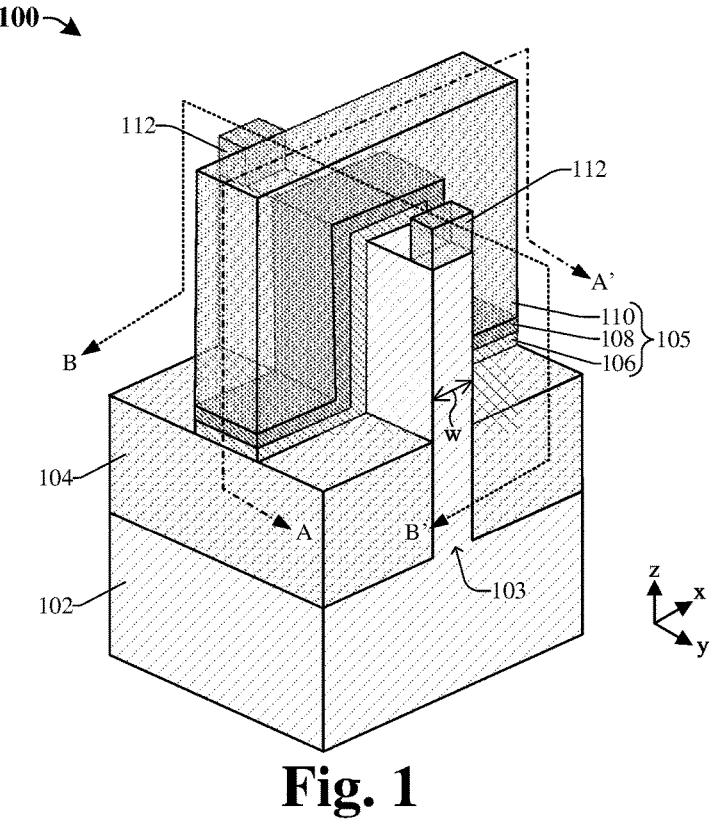
FIG. 1 illustrates a perspective view of some embodiments of a ferroelectric tunnel junction (FTJ) device comprising a ferroelectric layer overlying and disposed on opposing sidewalls of a fin structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric tunnel junction (FTJ) device is a type of ferroelectric random access memory (FeRAM) device that comprises a conductive structure over a semiconductor layer and a ferroelectric layer between the conductive structure and the semiconductor layer. During operation of an FTJ device, an application of a bias voltage to the conductive structure will generate an electric field that polarizes the ferroelectric layer. For example, by applying a first voltage to the conductive structure, the polarization of the ferroelectric layer may be in a first direction such that the ferroelectric layer has a first resistance indicating a first data state (e.g., logical "0"). Further, by applying a second voltage to the conductive structure, the polarization may be in a second direction that is opposite the first direction, such that the ferroelectric layer has a second resistance indicating a second data state (e.g., logical "1"). A memory window of the FTJ device may be defined by a difference of tunneling current of the first and second data states.

In an effort to scale device size and increase device density, thicknesses of the semiconductor layer and ferroelectric layer and a size of the conductive structure are reduced. However, decreasing the thickness of the semiconductor layer decreases the number of charge carriers (e.g., holes or electrons) that may accumulate in the semiconductor layer when applying a bias voltage to the conductive structure. The decreased number of charge carriers mitigates an ability to reinforce the polarization in the ferroelectric layer while in the first or second data states, thereby decreasing the memory window of the FTJ device. The number of charge carriers may be increased by adjusting a doping concentration of the semiconductor layer, but this may increase time and costs associated with forming the FTJ device.

Further, a read operation can be performed to read a data state of the ferroelectric layer and includes applying a read voltage across the ferroelectric layer. The read voltage generates a read current that may tunnel from the conductive structure, through the ferroelectric layer, to the semiconductor layer. The value of the read current is based upon a data state stored in the ferroelectric layer and it may be compared to a reference voltage in order to determine the data state stored in the ferroelectric layer. By decreasing a size of the conductive structure, an area of overlap between the conductive structure and the semiconductor layer is decreased, thereby decreasing a tunneling current density of the FTJ device. This reduces a speed and accuracy of the read operation, thereby reducing an overall performance of the FTJ device.

Accordingly, various embodiments of the present disclosure are related to an integrated chip having a ferroelectric tunnel junction (FTJ) device that comprises a ferroelectric layer disposed along sidewalls and an upper surface of a fin structure. The fin structure extends continuously from a semiconductor substrate through an isolation structure. A ferroelectric layer overlies the fin structure and extends along the opposing sidewalls of the fin structure. An upper conductive structure overlies the ferroelectric layer and is disposed along the opposing sidewalls of the fin structure. By virtue of the ferroelectric layer and upper conductive structure being disposed over and on the opposing sidewalls of the fin structure, an area of overlap between the upper conductive structure and the fin structure is increased relative to the upper conductive structure simply overlying a top surface of the fin structure. This increases a tunneling current density of the FTJ device, thereby increasing a speed and accuracy of read operations performed on the FTJ device. In addition, a number of charge carriers (e.g., holes or electrons) that may accumulate in the fin structure is increased by increasing a width of the fin structure. The increased number of charge carriers increases an ability to reinforce the polarization in the ferroelectric layer while in the first or second data states and thereby increases the memory window of the FTJ device.

FIG. 1 illustrates a perspective view of some embodiments of a ferroelectric tunnel junction (FTJ) device 100 comprising a ferroelectric layer 108 overlying and disposed on opposing sidewalls of a fin structure 103.

The FTJ device 100 includes a semiconductor substrate 102 that comprises a lower planar region and an upper region. In various embodiments, the FTJ device 100 may be referred to as a ferroelectric tunnel junction (FTJ). The upper region of the semiconductor substrate 102 includes the fin structure 103 which extends vertically (e.g., along the "z" direction) from the lower planar region. The fin structure 103 continuously extends laterally along the "y" direction. The semiconductor substrate 102 may comprise any type of semiconductor body (e.g., silicon, monocrystalline silicon/ CMOS bulk, silicon-germanium, germanium, germanium-tin, silicon-on-insulator (SOI), etc.). An isolation structure 104 is disposed along the lower planar region of the semiconductor substrate 102. The fin structure 103 continuously extends through the isolation structure 104. The isolation structure 104 may be referred to as a shallow trench isolation (STI) structure and may be or comprises an oxide (e.g., silicon dioxide), silicon nitride, silicon carbide, or another applicable dielectric material(s).

A ferroelectric memory stack 105 is disposed on the fin structure 103 and extends laterally in the "x" direction. In various embodiments, the ferroelectric memory stack 105 may be referred to as a memory gate stack. In some embodiments, the ferroelectric memory stack 105 includes a dielectric layer 106, the ferroelectric layer 108, and an upper electrode 110. In various embodiments, the upper electrode 110 may be referred to as a gate electrode. The dielectric layer 106 is disposed between the fin structure 103 and the ferroelectric layer 108, and the upper electrode 110 overlies the ferroelectric layer 108. The dielectric layer 106 may be configured to reduce leakage current and/or reduce oxygen vacancies in the fin structure 103. The reduced oxygen vacancies may mitigate charge carrier scattering in the fin structure 103. In some embodiments, the dielectric layer 106 may be referred to as a non-polar layer or a blocking layer. Further, a lower conductive pad structures 112 are disposed on/over the fin structure 103. The lower conductive pad structures 112 are laterally spaced apart from one another and are disposed on opposing sides of the upper electrode 110.

In various embodiments, by applying suitable voltage bias conditions to the upper electrode 110 and the lower conductive pad structures 112, a channel region may form in the fin structure 103 and/or an electric field is generated that polarizes the ferroelectric layer 108. In some embodiments, the channel region extends laterally in the second direction (e.g., along the "y" direction) between the lower conductive pad structures 112, such that tunneling current charge carriers may travel between the upper electrode 110 and the lower conductive pad structures 112. Depending on a value of the voltage bias applied to the upper electrode 110, a direction of the polarization of the ferroelectric layer 108 may be in a first direction or a second direction that is opposite the first direction. For example, applying a positive voltage to the upper electrode 110 may result in the polarization having the first direction that represents a first data state (e.g., a logical "0"), while applying a negative voltage to the upper electrode 110 may result in the polarization having the second direction that represents a second data state (e.g., a logical "1").

The upper electrode 110 and ferroelectric layer 108 directly overlie a top surface of the fin structure 103 and continuously extend along opposing sidewalls of the fin structure 103. This increases an area of overlap between the upper electrode 110 and the fin structure 103, thereby increasing a tunneling current density of the FTJ device 100. Thus, a speed and accuracy of read operations performed on the FTJ device 100 is increased. In addition, a number of charge carriers (e.g., holes or electrons) that may accumulate in a channel region of the fin structure 103 is increased by increasing a width w of the fin structure 103. The increased number of charge carriers increases an ability to reinforce the polarization in the ferroelectric layer 108 while in the first or second data states and thereby increases the memory window of the FTJ device 100.

Figure 2:
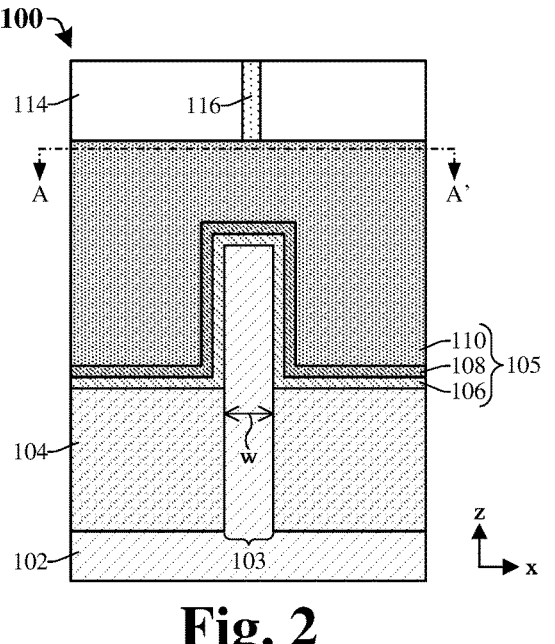
FIGS. 2 and 3 illustrate various cross-sectional views of some embodiments of the FTJ device of FIG. 1.

FIG. 2 illustrates a cross-sectional view of some embodiments of an FTJ device 100. In some embodiments, FIG. 2 illustrates a cross-sectional view of some embodiments of the FTJ device 100 taken along the line A-A' of FIG. 1 (e.g., along the "x" direction).

As illustrated in the cross-sectional view of FIG. 2, the isolation structure 104 overlies the lower planar region of the semiconductor substrate 102. The fin structure 103 continuously extends vertically from the lower planar region through a thickness of the isolation structure 104. The ferroelectric memory stack 105 overlies the fin structure 103 and the isolation structure 104. The ferroelectric memory stack 105 comprises the dielectric layer 106, the ferroelectric layer 108, and the upper electrode 110. The dielectric layer 106 continuously extends along a top surface of the isolation structure 104 to opposing sidewalls of the fin structure 103.

Further, the ferroelectric layer 108 is disposed on the opposing sidewalls of the fin structure 103 and extends over the top surface of the fin structure 103. Thus, the ferroelectric layer 108 continuously extends from a first point disposed above the top surface of the fin structure 103 to a second point below the top surface of the fin structure 103. The upper electrode 110 overlies the top surface of the fin structure 103 and is disposed on the opposing sidewalls of the fin structure 103. An inter-level dielectric (ILD) layer 114 overlies the ferroelectric memory stack 105. The ILD layer 114 comprise one or more stack dielectric layers, which may respectively be or comprise an oxide (e.g., silicon dioxide), a low-k dielectric material (e.g., a dielectric material with a dielectric constant less than about 3.9), another dielectric material, or any combination of the foregoing. A plurality of conductive contacts 116 are disposed within the ILD layer 114, where at least an individual conductive contact 116 contacts the upper electrode 110.

Figure 3:
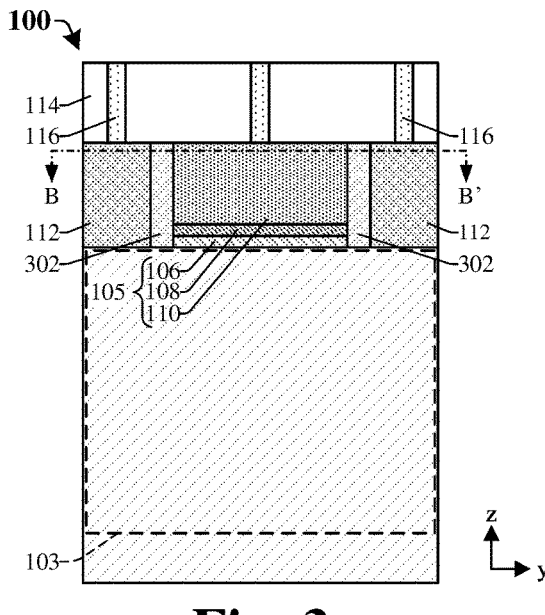

FIG. 3 illustrates a cross-sectional view of some embodiments of an FTJ device 100. In some embodiments, FIG. 3 illustrates a cross-sectional view of some embodiments of the FTJ device 100 taken along the line B-B' of FIG. 1 (e.g., along the "y" direction).

In various embodiments, the lower conductive pad structures 112 are disposed on the top surface of the fin structure 103. In yet further embodiments, the lower conductive pad structures 112 may be disposed at a point below the top surface of the fin structure 103, such that the lower conductive pad structures 112 are disposed within the fin structure 103 (e.g., see FIGS. 6A-6B). In yet further embodiments, the lower conductive pad structures 112 may respectively be doped regions of the semiconductor substrate 102 and/or may be or comprise doped epitaxial silicon, where the lower conductive pad structures 112 comprises a doping type opposite that of an adjacent region of the semiconductor substrate 102. The lower conductive pad structures 112 are disposed on opposing sides of the ferroelectric memory stack 105, where a sidewall spacer 302 is disposed laterally between the lower conductive pad structures 112 and the ferroelectric memory stack 105. The sidewall spacer 302 may be or comprise silicon nitride, silicon carbide, silicon oxynitride, silicon oxycarbide, another suitable dielectric material, or any combination of the foregoing. The ILD layer 114 overlies the ferroelectric memory stack 105. The plurality of conductive contacts 116 are disposed within the ILD layer 114 and contact the upper electrode 110 and the lower conductive pad structures 112.

In some embodiments, the dielectric layer 106 may be or comprise silicon dioxide, aluminum oxide, tantalum oxide, titanium oxide, hafnium oxide, tantalum oxynitride, titanium oxynitride, other dielectric material(s), or any combination of the foregoing. In further embodiments, the dielectric layer 106 has a thickness within a range of between about 0.5 to 2 nanometers (nm), about 2 nm, less than about 2 nm, or another suitable value. In yet further embodiments, a dielectric constant of the dielectric layer 106 is less than 28 or another suitable value. In some embodiments, the dielectric constant of the dielectric layer 106 is greater than the dielectric constant of the isolation structure 104. In various embodiments, the ferroelectric layer 108 may be or comprise a ferroelectric material, bismuth ferrite (e.g., $BiFeO_3$), lead titanate ($PbTiO_3$), barium titanate (e.g., $BaTiO_3$), hafnium oxide, zirconium dioxide, aluminum nitride, aluminum nitride doped with scandium, hafnium-zirconium-oxide, gallium nitride doped with scandium, some other suitable material, or any combination of the foregoing. In some embodiments, the ferroelectric layer 108 has a thickness within a range of between about 0.5 to 4 nm, about 4 nm, less than about 4 nm, or another suitable value. In further embodiments, the thickness of the ferroelectric layer 108 is greater than the thickness of the dielectric layer 106. In some embodiments, the upper electrode 110 may be or comprise titanium, tantalum, hafnium, titanium nitride, tantalum nitride, hafnium nitride, iridium oxide, ruthenium oxide, another conductive material, or any combination of the foregoing. In some embodiments, the lower conductive pad structures 112 may be or comprise a silicide (e.g., such as titanium silicide, cobalt silicon, etc.), a germanide (e.g., such as titanium germanide, cobalt germanide), a metal (e.g., such as titanium, tantalum, hafnium, etc.), a nitride (e.g., such as titanium nitride, tantalum nitride, hafnium nitride, etc.), iridium oxide, ruthenium oxide, other conductive material(s), or any combination of the foregoing. In some embodiments, the fin structure 103 is undoped and/or comprises intrinsic silicon, thereby omitting a doping process during fabrication of the FTJ device 100 and decreasing costs associated with fabricating the FTJ device 100.

FIGS. 4A-4C illustrate various views of some embodiments of an FTJ device 400 comprising a ferroelectric layer 108 overlying and disposed on opposing sides of a plurality of fin structures 103. FIGS. 4A and 4B illustrate cross-sectional views of some embodiments of the FTJ device 400. FIG. 4C illustrates a top view of some embodiments of the FTJ device 400. FIG. 4A illustrates a cross-sectional view of some embodiments of the FTJ device 400 taken along the line A-A' of FIG. 4C. FIG. 4B illustrates a cross-sectional view of some embodiments of the FTJ device 400 taken along the line B-B' of FIG. 4C.

As shown in the cross-sectional view of FIG. 4A, the ferroelectric memory stack 105 overlies the fin structure 103 and comprises the dielectric layer 106, the ferroelectric layer 108, and the upper electrode 110. The fin structure 103 extends vertically through the isolation structure 104. In some embodiments, the dielectric layer 106 and the ferroelectric layer 108 are respectively U-shaped and have bottom surfaces that are coplanar with one another. In various embodiments, the bottom surface of the dielectric layer 106 directly contacts a top surface of the isolation structure 104 and the bottom surface of the ferroelectric layer 108 directly contacts the top surface of the isolation structure 104. In further embodiments, a bottom surface of the upper electrode 110 is aligned with the bottom surface of the dielectric layer 106 and the bottom surface of the ferroelectric layer 108. Further, the bottom surfaces of the dielectric layer 106 and the ferroelectric layer 108 are disposed vertically below a top surface of the fin structure 103. A conductive contact 116 is disposed within an ILD layer 114 and is electrically coupled to the upper electrode 110.

As shown in the cross-sectional view of FIG. 4B, a lower conductive pad structures 112 are disposed on opposing sides of the ferroelectric memory stack 105. A sidewall spacer 302 is disposed laterally between the lower conductive pad structures 112 and the ferroelectric memory stack 105. Conductive contacts 116 are disposed respectively on the lower conductive pad structures 112 and the upper electrode 110.

As shown in the top view of FIG. 4C, each of the fin structures 103 extend in parallel with one another along the "y" direction. The fin structures 103 are laterally spaced from one another along the "x" direction. In some embodiments, the ferroelectric memory stack 105 continuously laterally extends along each of the fin structures 103 in the "x" direction. In various embodiments, the dielectric layer 106 and the ferroelectric layer 108 are discontinuous on opposing sides of each fin structure 103 and the upper electrode 110 continuously laterally extends in the "x" direction along each fin structure 103. In yet further embodiments, the dielectric layer 106, the ferroelectric layer 108, and the upper electrode 110 respectively continuously laterally extend in the "x" direction along each of the fin structures 103. In some embodiments, the fin structures 103 respectively have a width w. Further, in some embodiments, lower conductive pad structures 112 are disposed on each of the fin structures 103.

Figure 5A:
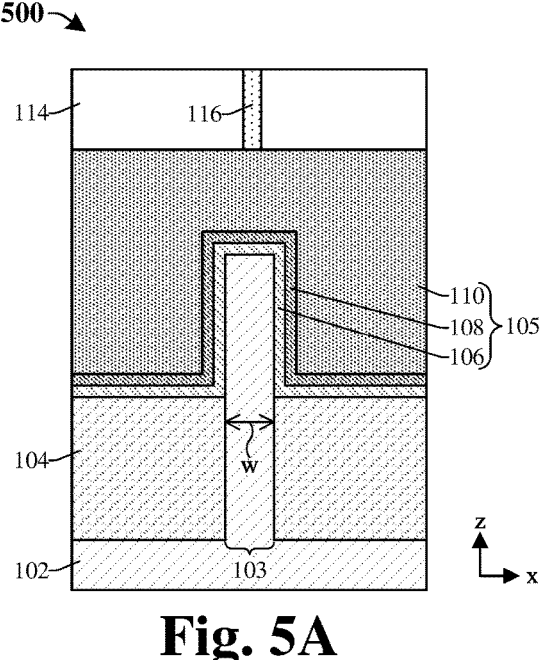
Figure 5B:
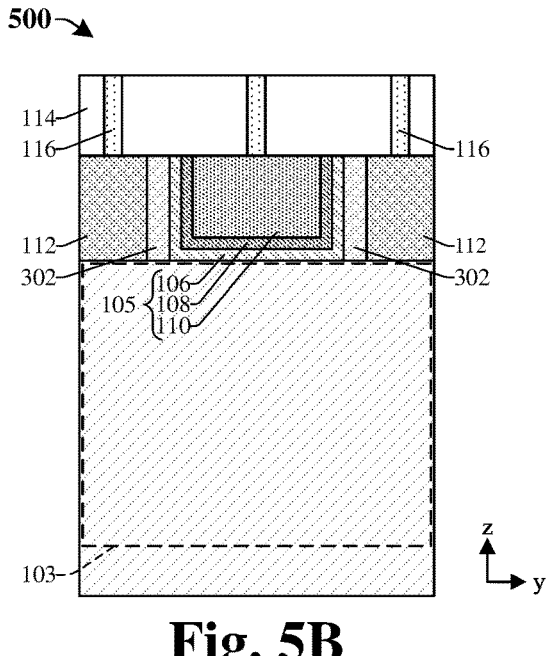

FIGS. 5A-5B illustrate various cross-sectional views of some embodiments of an FTJ device 500 corresponding to some alternative embodiments of the FTJ device 100 of FIGS. 1-3. FIG. 5A illustrates a cross-sectional view of some embodiments of the FTJ device 500 taken along the "x" direction and FIG. 5B illustrates a cross-sectional view of some embodiments of the FTJ device 500 taken along the "y" direction. As shown in FIG. 5A, the dielectric layer 106 and the ferroelectric layer 108 continuously laterally extend along the top surface of the isolation structure 104. As shown in FIG. 5B, in some embodiments, the dielectric layer 106 and the ferroelectric layer 108 are respectively U-shaped, where the ferroelectric layer 108 continuously extends along sidewalls of the upper electrode 110 and cup an underside of the upper electrode 110. In yet further embodiments, the dielectric layer 106 extends along sidewalls of the ferroelectric layer 108 and cup and underside of the ferroelectric layer 108. In such embodiments, the dielectric layer 106 is spaced laterally between the ferroelectric layer 108 and the sidewall spacer 302. In yet further embodiments, the sidewall spacer 302 is omitted (not shown), such that the dielectric layer 106 laterally separates the ferroelectric layer 108 from the lower conductive pad structures 112.

Figure 6A:
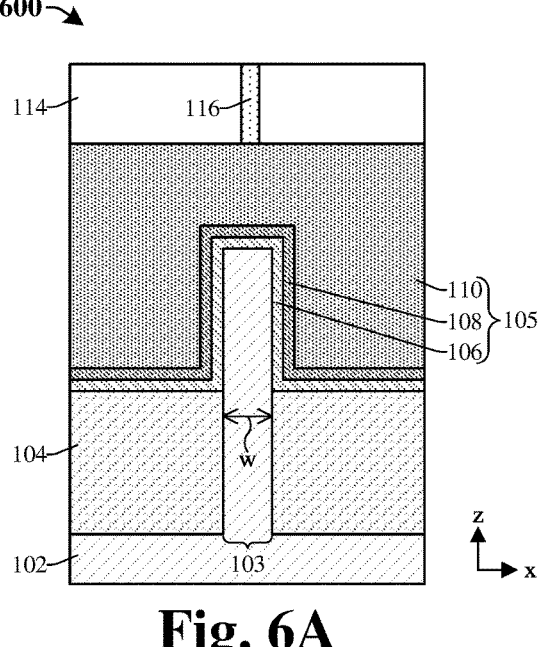
Figure 6B:
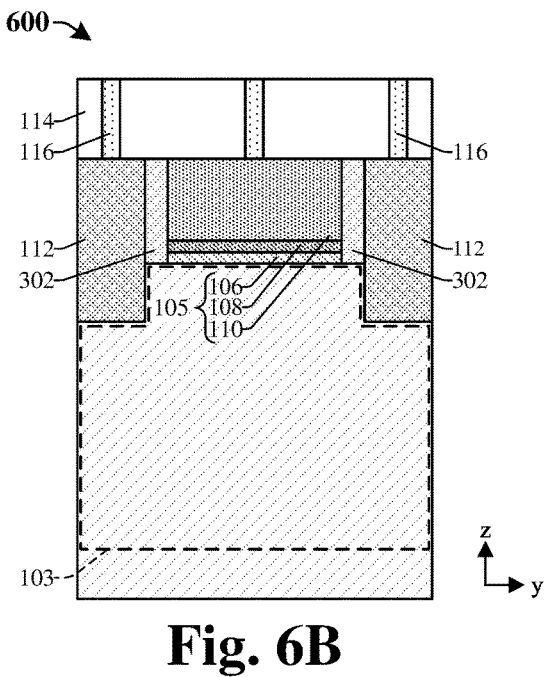

FIGS. 6A-6B illustrate various cross-sectional views of some embodiments of an FTJ device 600 corresponding to some alternative embodiments of the FTJ device 100 of FIGS. 1-3. FIG. 6A illustrates a cross-sectional view of some embodiments of the FTJ device 600 taken along the "x" direction and FIG. 6B illustrates a cross-sectional view of some embodiments of the FTJ device 600 taken along the "y" direction. As shown in FIG. 6B, in some embodiments, the lower conductive pad structures 112 are disposed within the fin structure 103, such that bottom surfaces of the lower conductive pad structures 112 are disposed vertically below a top surface of the fin structure 103. In such embodiments, the lower conductive pad structures 112 may respectively be or comprise epitaxial silicon.

FIGS. 7A-7B illustrate various cross-sectional views of some embodiments of an FTJ device 700 corresponding to some alternative embodiments of the FTJ device 100 of FIGS. 1-3, where the dielectric layer (106 of FIGS. 1-3) is omitted. In some embodiments, as shown in FIG. 7A, the ferroelectric layer 108 directly contacts opposing sidewalls of the fin structure 103 and a top surface of the fin structure 103. In yet further embodiments, as shown in FIG. 7B, a bottom surface of the ferroelectric layer 108 is aligned with a bottom surface of the sidewall spacer 302 and/or a bottom surface of the lower conductive pad structures 112.

Figure 8B:
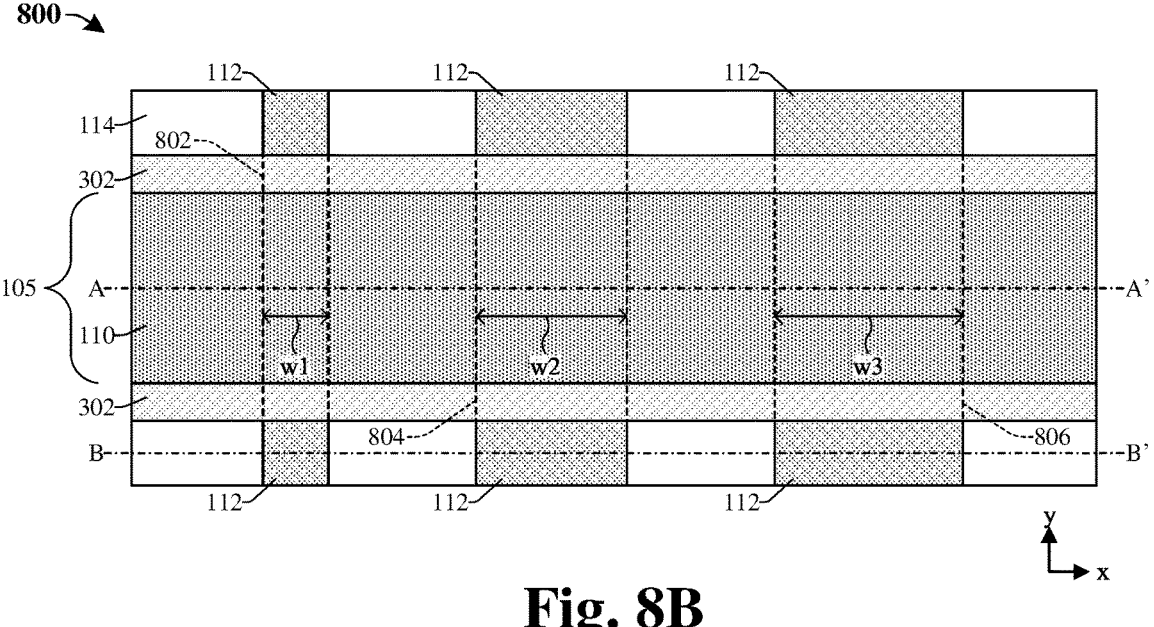
Figure 8C:
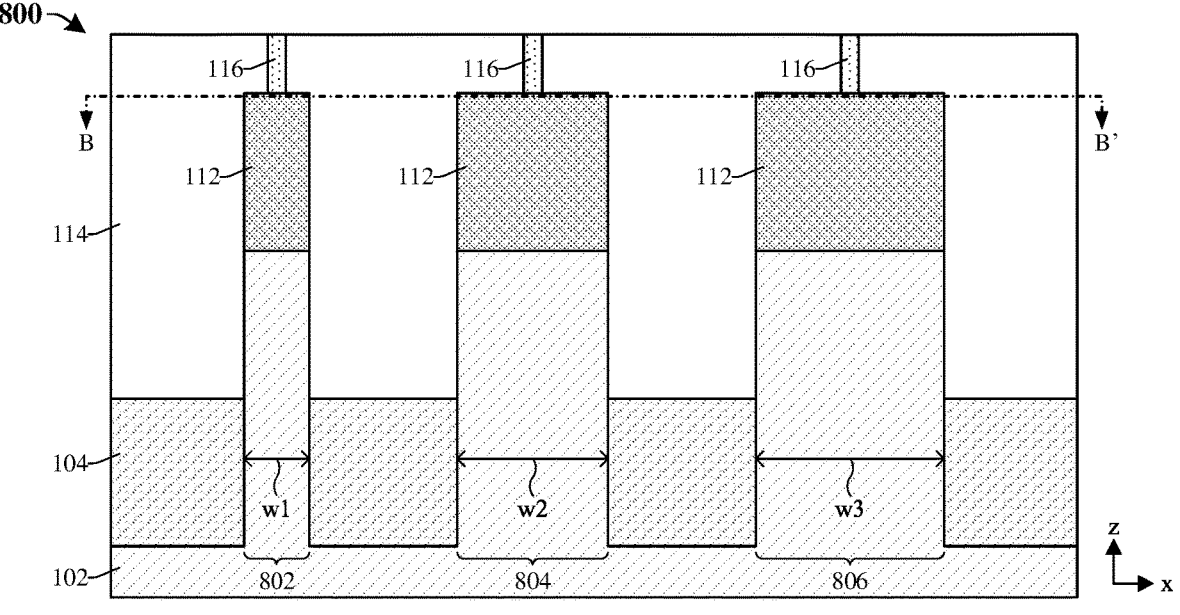

FIGS. 8A-8C illustrate various views of some embodiments of an FTJ device 800 according to some alternative embodiments of the FTJ device 400 of FIGS. 4A-4C. FIG. 8B illustrates a top view of some embodiments of the FTJ device 800. FIG. 8A illustrates a cross-sectional view of some embodiments of the FTJ device 800 taken along the line A-A' of FIG. 8B. FIG. 8C illustrates a cross-sectional view of some embodiments of the FTJ device 800 taken along the line B-B' of FIG. 8B.

The FTJ device 800 comprises a plurality of fin structures 802-806 extending vertically from a lower planar region of the semiconductor substrate 102 through the isolation structure 104. The plurality of fin structures 802-806 includes a first fin structure 802, a second fin structure 804, and a third fin structure 806. The first fin structure 802 has a first width w1, the second fin structure 804 has a second width w2, and the third fin structure 806 has a third width w3. In some embodiments, the first width w1 is less than the second width w2 and the second width w2 is less than the third width w3. In further embodiments, a difference between the second width w2 and the first width w1 (e.g., w2−w1) is greater than about 1 nm and/or a difference between the third width w3 and the second width w2 (e.g., w3−w2) is greater than about 1 nm. In various embodiments, the ferroelectric memory stack 105 continuously extends across the first, second, and third fin structures 802-806.

As shown in FIGS. 8B and 8C, lower conductive pad structures 112 are disposed on each fin structure in the plurality of fin structures 802-806 and on opposing sides of the ferroelectric memory stack 105. A sidewall spacer 302 separates the ferroelectric memory stack 105 from the lower conductive pad structures 112. In various embodiments, the lower conductive pad structures 112 respectively have a same width as an underlying fin structure in the plurality of fin structures 802-806.

Figure 9A:
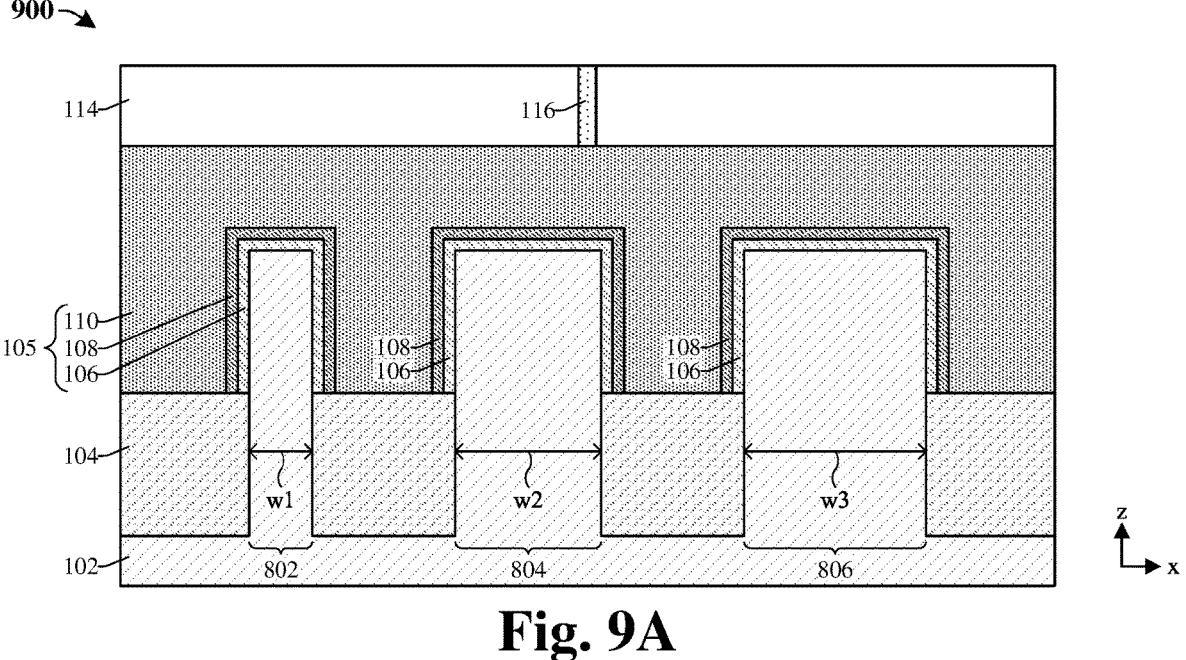
FIGS. 9A-9B illustrate various cross-sectional views of some different embodiments of the FTJ device of FIGS. 8A-8C.
Figure 9B:
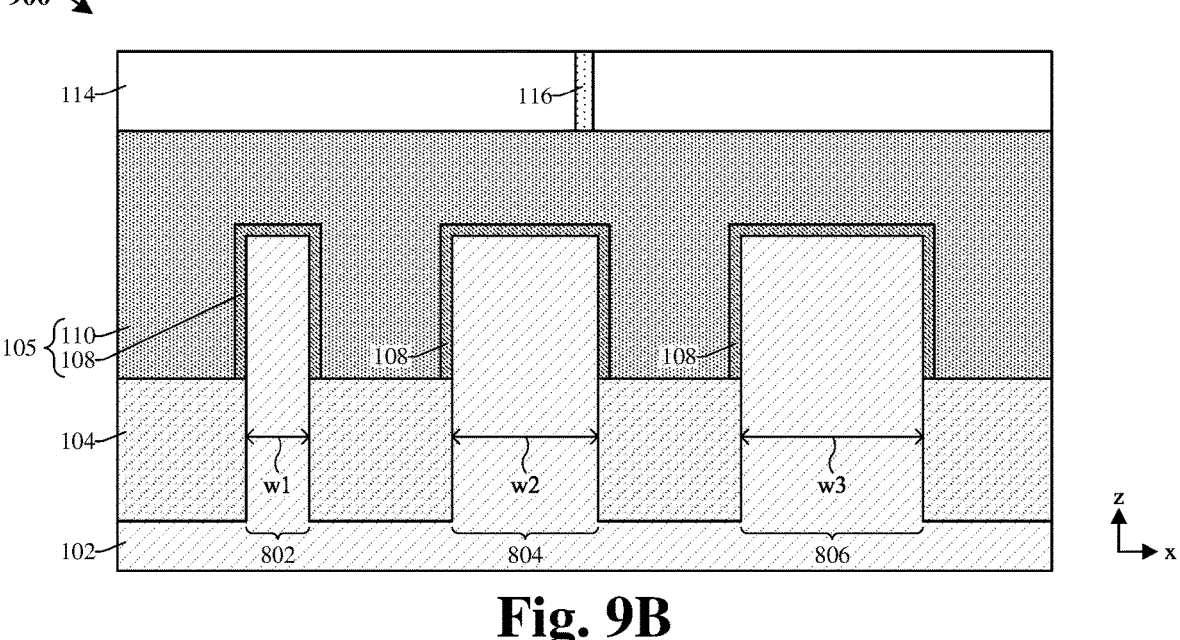

FIGS. 9A-9B illustrate various cross-sectional views of some embodiments of an FTJ device 900 corresponding to some alternative embodiments of the FTJ device 800 of FIGS. 8A-8C. As shown in FIG. 9A, the ferroelectric memory stack 105 comprises the upper electrode 110, the dielectric layer 106, and the ferroelectric layer 108, where the dielectric layer 106 and the ferroelectric layer 108 are respectively U-shaped. Further, bottom surfaces of the dielectric layer 106 and the ferroelectric layer 108 are coplanar with one another. As shown in FIG. 9B, the dielectric layer (106 of FIG. 9A) is omitted such that the ferroelectric layer 108 directly contacts each fin structure in the plurality of fin structures 802-806.

FIGS. 10A-10B through 15A-15B illustrate various cross-sectional views of some embodiments of a method for forming an FTJ device having a ferroelectric layer disposed on opposing sides and an upper surface of a fin structure. Figures with a suffix of "A" illustrate a cross-sectional view taken along the "x" direction (e.g., taken along line A-A' of FIG. 4C) during various formation processes. Figures with a suffix of "B" illustrate a cross-sectional view taken along the "y" direction (e.g., taken along line B-B' of FIG. 4C) during various formation processes. Although FIGS. 10A-10B through 15A-15B are described in relation to a series of acts, it will be appreciated that the order of the acts may in some cases be altered and that this series of acts are applicable to structures other than the ones illustrated. In some embodiments, some of these acts may be omitted in whole or in part. Further, it will be appreciated that the structures shown in FIGS. 10A-10B through 15A-15B are not limited to the method of formation but rather may stand alone as structures separate of the method.

As shown in cross-sectional views 1000a and 1000b of FIGS. 10A-10B, an etching process is performed on the semiconductor substrate 102 to form a fin structure 103 that extends from a lower planar region of the semiconductor substrate 102. In some embodiments, the etching process includes: forming a masking layer 1002 over the semiconductor substrate 102; exposing the semiconductor substrate 102 to one or more etchants; and performing a removal process to remove the masking layer 1002 (not shown). In various embodiments, the semiconductor substrate 102 may be or comprise silicon, monocrystalline silicon, intrinsic silicon, CMOS bulk, silicon-germanium, germanium, germanium-tin, silicon-on-insulator (SOI), another semiconductor material, or any combination of the foregoing. In yet further embodiments, the fin structure 103 is undoped and/or comprises intrinsic silicon.

As shown in cross-sectional views 1100a and 1100b of FIGS. 11A-11B, an isolation structure 104 is formed over the semiconductor substrate 102. In some embodiments, the isolation structure 104 may be formed by chemical vapor deposition (CVD), physical vapor deposition (PVD), atomic layer deposition (ALD), or another suitable deposition or growth process. The isolation structure 104 is disposed on opposing sides of the fin structure 103. Further, the isolation structure 104 may, for example, be or comprise silicon dioxide, silicon nitride, silicon carbide, another dielectric material, or any combination of the foregoing.

As shown in cross-sectional views 1200a and 1200b of FIGS. 12A-12B, a ferroelectric memory stack 105 is formed over the fin structure 103 and the isolation structure 104. The ferroelectric memory stack 105 comprises a dielectric layer 106, a ferroelectric layer 108, and an upper electrode 110. In some embodiments, a process for forming the ferroelectric memory stack 105 includes: depositing (e.g., by CVD, PVD, ALD, etc.) the dielectric layer 106 over the fin structure 103; depositing (e.g., by CVD, PVD, ALD, etc.) the ferroelectric layer 108 over the dielectric layer 106; depositing (e.g., by CVD, PVD, ALD, sputtering, electro plating, etc.) the upper electrode 110 over the ferroelectric layer 108; forming a masking layer (not shown) over the upper electrode 110; and etching the upper electrode 110, the ferroelectric layer 108, and the dielectric layer 106 according to the masking layer. In further embodiments, the dielectric layer 106 may be omitted (not shown), such that the ferroelectric layer 108 directly contacts the fin structure 103.

The dielectric layer 106 may, for example, be or comprise silicon dioxide, aluminum oxide, tantalum oxide, titanium oxide, hafnium oxide, tantalum oxynitride, titanium oxynitride, other dielectric material(s), or any combination of the foregoing. In some embodiments, the dielectric layer 106 is formed to a thickness within a range of between about 0.5 to 2 nanometers (nm), about 2 nm, less than about 2 nm, or another suitable value. The ferroelectric layer 108 may, for example, be or comprise a ferroelectric material, bismuth ferrite (e.g., $BiFeO_3$), lead titanate ($PbTiO_3$), barium titanate (e.g., $BaTiO_3$), hafnium oxide, zirconium dioxide, aluminum nitride, aluminum nitride doped with scandium, hafnium-zirconium-oxide, gallium nitride doped with scandium, some other suitable material, or any combination of the foregoing. In some embodiments, the ferroelectric layer 108 is formed to a thickness within a range of between about 0.5 to 4 nm, about 4 nm, less than about 4 nm, or another suitable value. In various embodiments, the thickness of the ferroelectric layer 108 is greater than the thickness of the dielectric layer 106. The upper electrode 110 may, for example, be or comprise titanium, tantalum, hafnium, titanium nitride, tantalum nitride, hafnium nitride, iridium oxide, ruthenium oxide, another conductive material, or any combination of the foregoing.

As shown in cross-sectional views 1300a and 1300b of FIGS. 13A-13B, a sidewall spacer 302 is formed on opposing sides of the ferroelectric memory stack 105. In some embodiments, the sidewall spacer 302 may be deposited by CVD, PVD, ALD, or another suitable deposition or growth process. The sidewall spacer 302 may, for example, be or comprise silicon dioxide, silicon nitride, silicon carbide, silicon oxynitride, silicon oxycarbide, another dielectric material, or any combination of the foregoing.

Figure 14A:
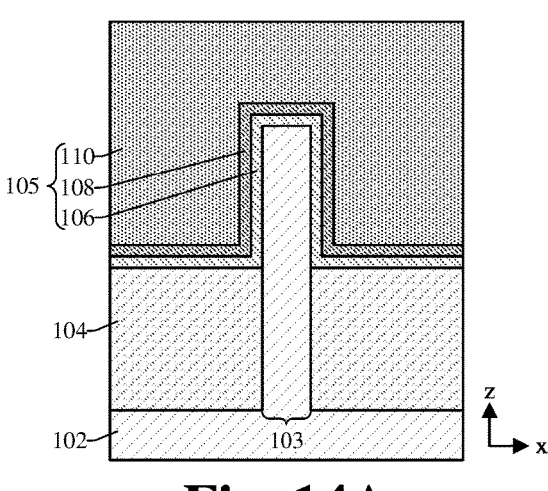
Figure 14B:
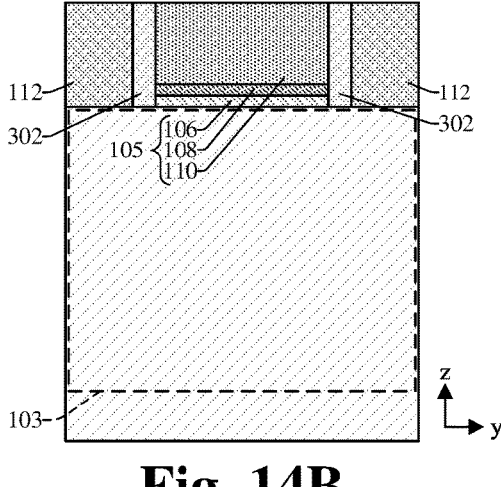

As shown in cross-sectional views 1400a and 1400b of FIGS. 14A-14B, lower conductive pad structures 112 are formed on the fin structure 103. The lower conductive pad structures 112 are disposed on opposing sides of the ferroelectric memory stack 105. In some embodiments, the lower conductive pad structures 112 are deposited by CVD, PVD, ALD, sputtering, or another suitable growth or deposition process. In various embodiments, a planarization process (e.g., a chemical mechanical polishing (CMP) process) is performed on the lower conductive pad structures 112 such that an upper surface of the lower conductive pad structures

112 is co-planar with an upper surface of the upper electrode 110 and/or an upper surface of the sidewall spacer 302. The lower conductive pad structures 112 may, for example, be or comprise a silicide (e.g., such as titanium silicide, cobalt silicon, etc.), a germanide (e.g., such as titanium germanide, cobalt germanide), a metal (e.g., such as titanium, tantalum, hafnium, etc.), a nitride (e.g., such as titanium nitride, tantalum nitride, hafnium nitride, etc.), iridium oxide, ruthenium oxide, other conductive material(s), or any combination of the foregoing.

Figure 15A:
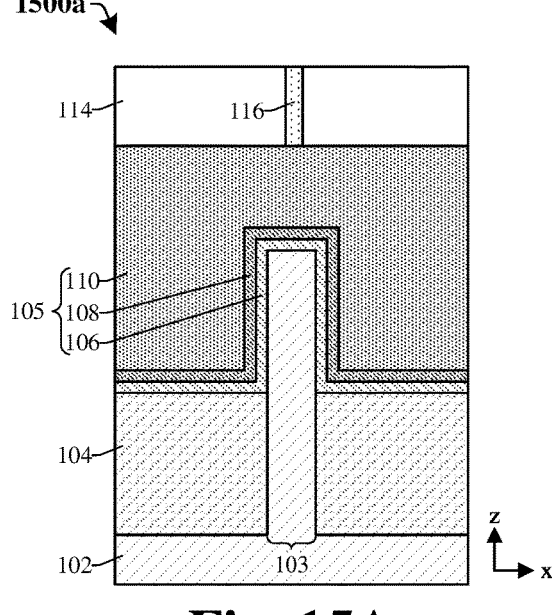
Figure 15B:
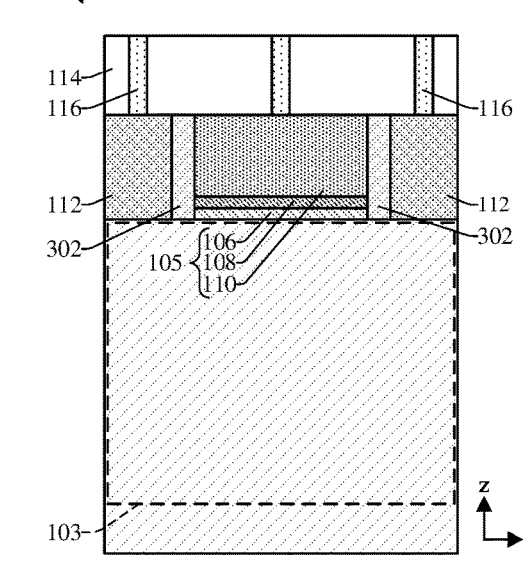

As shown in cross-sectional views 1500a and 1500b of FIGS. 15A-15B, an inter-level dielectric (ILD) layer 114 is formed over the ferroelectric memory stack 105 and the lower conductive pad structures 112. Further, a plurality of conductive contacts 116 are formed within the ILD layer 114. In some embodiments, the ILD layer 114 may be deposited by PVD, CVD, ALD, or another suitable deposition or growth process. The ILD layer 114 may, for example, be or comprise silicon dioxide, a low-k dielectric material, or another dielectric material. The plurality of conductive contacts 116 may, for example, be or comprise copper, ruthenium, titanium nitride, tantalum nitride, tungsten, another conductive material, or any combination of the foregoing.

FIG. 16 illustrates a flow chart 1600 of some embodiments of a method for forming an FTJ device having a ferroelectric layer disposed on opposing sides and an upper surface of a fin structure according to aspects of the present disclosure. Although the flow chart 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, an etch process is performed on a semiconductor substrate to form a fin structure extending vertically from a lower planar region of the semiconductor substrate. FIGS. 10A-10B illustrate cross-sectional views 1000a and 1000b corresponding to some embodiments of act 1602.

At act 1604, an isolation structure is formed on the semiconductor substrate. FIGS. 11A-11B illustrate cross-sectional views 1100a and 1100b corresponding to some embodiments of act 1604.

At act 1606, a ferroelectric memory stack is formed over the fin structure, where the ferroelectric memory stack includes a dielectric layer, a ferroelectric layer, and an upper electrode. The ferroelectric layer extends along opposing sidewalls and an upper surface of the fin structure. FIGS. 12A-12B illustrate cross-sectional views 1200a and 1200b corresponding to some embodiments of act 1606.

At act 1608, a sidewall spacer is formed on opposing sides of the ferroelectric memory stack. FIGS. 13A-13B illustrate cross-sectional views 1300a and 1300b corresponding to some embodiments of act 1608.

At act 1610, lower conductive pad structures are formed on the fin structure, where the lower conductive pad structures are disposed on opposing sides of the ferroelectric memory stack. FIGS. 14A-14B illustrate cross-sectional views 1400a and 1400b corresponding to some embodiments of act 1610.

At act 1612, a plurality of conductive contacts is formed over the ferroelectric memory stack and the lower conductive pad structures. FIGS. 15A-15B illustrate cross-sectional views 1500a and 1500b corresponding to some embodiments of act 1612.

Accordingly, in some embodiments, the present disclosure relates to a ferroelectric memory device that comprises a ferroelectric layer disposed along opposing sidewalls and an upper surface of a fin structure that extends vertically from a lower planar region of a semiconductor substrate.

In some embodiments, the present application provides an integrated chip, including: a fin structure extending vertically from a semiconductor substrate, where the fin structure continuously extends laterally along a first direction; and a ferroelectric memory stack overlying the fin structure and continuously laterally extending along a second direction that is substantially perpendicular to the first direction, where the ferroelectric memory stack includes an upper electrode overlying a ferroelectric layer, where the ferroelectric layer extends along opposing sidewalls and an upper surface of the fin structure.

In further embodiments, the present application provides a memory device, including: a first fin structure and a second fin structure extending vertically from a semiconductor substrate, where the first fin structure and the second fin structure extend in parallel with one another; a dielectric layer disposed along opposing sidewalls of the first fin structure and opposing sidewalls of the second fin structure; an upper electrode overlying the semiconductor substrate, where the upper electrode continuously extends laterally from the first fin structure to the second fin structure, where a bottom surface of the upper electrode is disposed below top surfaces of the first and second fin structures; and a ferroelectric layer disposed between the upper electrode and the first and second fin structures.

In yet further embodiments, the present application provides a method for forming an integrated chip, the method includes: forming a fin structure on a semiconductor substrate; forming a dielectric layer over the fin structure; forming a ferroelectric layer over the dielectric layer, where the ferroelectric layer is disposed along an upper surface and opposing sidewalls of the fin structure; and forming an upper electrode over the ferroelectric layer and the fin structure, where a bottom surface of the upper electrode is disposed below a top surface of the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:

forming a fin structure on a semiconductor substrate;

forming a dielectric layer over a top surface of the fin structure;

forming a ferroelectric layer over the dielectric layer, wherein the ferroelectric layer is disposed along an upper surface and opposing sidewalls of the fin structure; and forming an upper electrode over the ferroelectric layer and the fin structure, wherein a bottom surface of the upper electrode is disposed below a top surface of the ferroelectric layer;

forming a sidewall spacer over the fin structure and along sidewalls of the ferroelectric layer and the upper electrode;

forming a pair of lower conductive pad structures over the fin structure and on opposing sides of the upper electrode, wherein the sidewall spacer is spaced between the upper electrode and the lower conductive pad structures, wherein top surfaces of the lower conductive pad structures are aligned with a top surface of the sidewall spacer, wherein the lower conductive pad structures contact the top surface of the fin structure, wherein heights of the lower conductive pad structures are both equal to a vertical distance between the top surface of the sidewall spacer and the top surface of the fin structure; and forming an inter-level dielectric (ILD) layer over the sidewall spacer and the pair of lower conductive pad structures, wherein the ILD layer extends along opposing sidewalls of the sidewall spacer and a top surface of the ILD layer is above the top surface of the sidewall spacer.

2. The method of claim 1, wherein a thickness of the ferroelectric layer is greater than a thickness of the dielectric layer.

3. The method of claim 1, further comprising:

forming an isolation structure over the semiconductor substrate and on opposing sides of the fin structure, wherein the ferroelectric layer continuously extends along an upper surface of the isolation structure.

4. The method of claim 3, wherein a bottom surface of the dielectric layer directly contacts the upper surface of the isolation structure.

5. The method of claim 1, wherein the pair of lower conductive pad structures comprise a metal.

6. The method of claim 1, wherein the fin structure continuously laterally extends along a first direction, wherein the ferroelectric layer and the upper electrode continuously laterally extend along a second direction substantially orthogonal to the first direction.

7. The method of claim 6, wherein a width of the upper electrode along the second direction is greater than a width of the fin structure along the first direction.

8. A method for forming an integrated chip, the method comprising:

performing a first etch process on a semiconductor substrate to form a plurality of fin structures extending vertically from a lower planar surface of the semiconductor substrate, wherein the plurality of fin structures comprises a first fin structure having a first width and a second fin structure having a second width greater than the first width, wherein the first fin structure is laterally offset from the second fin structure by a first lateral distance, wherein the first lateral distance is greater than the first width;

depositing an isolation structure over the lower planar surface and on opposing sidewalls of the first fin structure and opposing sidewalls of the second fin structure;

forming a ferroelectric memory stack on the plurality of fin structures and the isolation structure, wherein the ferroelectric memory stack comprises a ferroelectric layer on the plurality of fin structures and an electrode on the ferroelectric layer;

forming a first conductive contact and a second conductive contact over the first fin structure and on opposing sides of the ferroelectric memory stack, wherein opposing sidewalls of the first conductive contact and opposing sidewalls of the second conductive contact are elongated in a first direction and aligned with the opposing sidewalls of the first fin structure; and forming a third conductive contact and a fourth conductive contact over the second fin structure and on the opposing sides of the ferroelectric memory stack, wherein opposing sidewalls of the third conductive contact and opposing sidewalls of the fourth conductive contact are elongated in the first direction and aligned with the opposing sidewalls of the second fin structure, wherein the first, second, third, and fourth conductive contacts comprise a same material, wherein widths of the third and fourth conductive contacts are greater than the first width, and wherein lengths of the first and second conductive contacts taken along the first direction are both less than the widths of the third and fourth conductive contacts.

9. The method of claim 8, wherein heights of the first and second fin structures are greater than a height of the ferroelectric layer.

10. The method of claim 8, wherein forming the ferroelectric memory stack comprises:

conformally depositing the ferroelectric layer on top surfaces and the opposing sidewalls of the first and second fin structures;

conformally depositing the electrode on the ferroelectric layer; and performing a second etch process on the electrode and the ferroelectric layer.

11. The method of claim 8, wherein the opposing sidewalls of the first and second fin structures are elongated in the first direction and opposing sidewalls of the ferroelectric memory stack are elongated in a second direction substantially orthogonal to the first direction, the method further comprising:

forming a sidewall spacer on the opposing sidewalls of the ferroelectric memory stack, wherein the sidewall spacer is elongated in the second direction.

12. The method of claim 8, wherein a thickness of the ferroelectric layer is less than four times a difference between the second width and the first width.

13. The method of claim 8, wherein the first fin structure is undoped in a region between the first and second conductive contacts and the second fin structure is undoped in a region between the third and fourth conductive contacts, wherein the region of the first fin structure directly contacts a first lower surface of the ferroelectric memory stack and the region of the second fin structure directly contacts a second lower surface of the ferroelectric memory stack.

14. A method for forming an integrated chip, the method comprising:

performing a first etch process on a semiconductor substrate to form a pillar structure in the semiconductor substrate over a base region of the semiconductor substrate;

depositing a dielectric layer on opposing sidewalls of the pillar structure;

depositing a ferroelectric layer on the dielectric layer, wherein a bottom surface of the ferroelectric layer is vertically offset from a top surface of the pillar structure by a first vertical distance;

depositing an electrode structure on the ferroelectric layer, wherein the dielectric layer and the ferroelectric layer are spaced between the opposing sidewalls of the pillar structure and inner opposing sidewalls of the electrode structure; and forming a pair of lower conductive pad structures over the pillar structure and on opposing sides of the electrode structure, wherein opposing sidewalls of the lower conductive pad structures are aligned with the opposing sidewalls of the pillar structure, wherein top surfaces of the lower conductive pad structures are aligned with a top surface of the electrode structure and heights of the lower conductive pad structures are less than the first vertical distance, wherein the heights of the lower conductive pad structures are equal to a second vertical distance between a lateral surface of the dielectric layer on the pillar structure and the top surface of the electrode structure.

15. The method of claim 14, wherein a height of the pillar structure is greater than a distance between the opposing sidewalls of the pillar structure.

16. The method of claim 14, wherein the pillar structure is undoped.

17. The method of claim 14, wherein the bottom surface of the ferroelectric layer is aligned with a bottom surface of the dielectric layer and a bottom surface of the electrode structure.

18. The method of claim 14, wherein a thickness of the dielectric layer is within a range of 0.5 to 2 nanometers (nm) and a thickness of the ferroelectric layer is within a range of 0.5 to 4 nm.

19. The method of claim 1, wherein the top surface of the fin structure laterally extends continuously along a first lateral distance from a first conductive pad structure in the pair of lower conductive pad structures to a second conductive pad structure in the pair of lower conductive pad structures, and wherein the fin structure is undoped across the first lateral distance.

20. The method of claim 1, wherein a top surface of the upper electrode is aligned with the top surface of the sidewall spacer.

* * * * *